United States Patent [19]
Beale et al.

[11] Patent Number: 5,790,615
[45] Date of Patent: Aug. 4, 1998

[54] DIGITAL PHASE-LOCK LOOP NETWORK

[75] Inventors: Terrance Ralph Beale, Kokomo; Mathew Alan Boytim, Westfield, both of Ind.

[73] Assignee: Delco Electronics Corporation, Kokomo, Ind.

[21] Appl. No.: 574,096

[22] Filed: Dec. 11, 1995

[51] Int. Cl.$^6$ ................................................ H03D 3/24
[52] U.S. Cl. ................................ 375/376; 370/208
[58] Field of Search ............................ 375/355, 356, 375/372, 376; 331/7, 11, 34, 40; 364/552, 571.01, 571.05; 370/208, 231, 236, 506, 512, 528, 530; 381/6, 24, 56

[56] References Cited

U.S. PATENT DOCUMENTS

| | | | |
|---|---|---|---|
| 4,001,690 | 1/1977 | Mack et al. | 375/356 |
| 4,215,239 | 7/1980 | Gordy et al. | 375/376 |
| 4,565,975 | 1/1986 | Gegner et al. | 375/376 |
| 4,811,340 | 3/1989 | McEachern et al. | 375/372 |
| 5,065,413 | 11/1991 | Fukuda | 375/376 |
| 5,245,667 | 9/1993 | Lew | 375/355 |
| 5,367,545 | 11/1994 | Yamashita et al. | 375/372 |

OTHER PUBLICATIONS

Digital Sound Broadcasting to Vehicular, Portable, and Fixed Receivers for BSS (Sound) in the frequency range 500–3000 MHz, Document 10/30–E, 10 Dec. 1991.

Digital Sound Broadcasting to Mobile Receivers, Bernard Le Floch, Roselyne Halbert–Lassalle, Damien Castelain, IEEE Transactions on Consumer Electronics, vol. 35, #3 Aug. '89.

*Primary Examiner*—Stephen Chin
*Assistant Examiner*—Joseph Roundtree
*Attorney, Agent, or Firm*—Jimmy L. Funke

[57] ABSTRACT

A digital phase-lock loop network that provides input and output clock signals to a digital data receiving system generally, and particularly to a data buffer contained therein, is disclosed. The digital phase-lock loop network provides bit-clock synchronization using a fixed input clock and an output clock having a variable frequency that is adjusted to correspond to the average input rate of the data samples into the data buffer. The digital phase-lock loop network allows the data buffer to be operated as a temporary storage device maintaining a nominal number of data samples therein at all times by avoiding any overflow and underflow data handling conditions that may otherwise cause loss of data. The digital phase-lock loop network of the present invention is particularly suited for the Eureka-147 system which has become a worldwide standard for digital audio broadcasting (DAB) technology.

18 Claims, 4 Drawing Sheets

DIGITAL PHASE-LOCK LOOP NETWORK

CROSS REFERENCE TO RELATED U.S. PATENT APPLICATIONS

The present application relates to U.S. Patent Applications having Ser. Nos. 08/570,213, 08/570,456, and 08/574,095 and having Attorney Docket Nos. H-169,949, H-169,950, and H-169,951, respectively, all of which patent applications are related to a digital audio broadcasting (DAB) system.

FIELD OF THE INVENTION

The present invention relates to a digital phase-lock loop network that is particularly suited for digital signal processing systems. More particularly, the present invention relates to a digital phase-lock loop network that is particularly suited for a digital audio broadcasting (DAB) system that employs differential encoding of data compressed information contained in multiple carriers which are transmitted simultaneously. Specifically, the present invention relates to a digital phase-lock loop network cooperating with a data buffer, both of which are particularly suited for a Eureka-147 system that differentially encodes, on a carrier-by-carrier basis, data compressed digital audio or data information. The digital phase-lock loop network controls the output flow rate of the data buffer so as to acquire and maintain sample-clock timing synchronization between the transmitting and receiving elements of the Eureka-147 system.

BACKGROUND OF THE INVENTION

Digital techniques for the transmission and receipt of sound information, sometimes referred to as digital audio broadcasting (DAB), have progressed over the past few years and are anticipated, on a world wide basis, to replace the present frequency modulation (FM) method of transmitting sound. Digital audio broadcasting (DAB) is not only anticipated to replace FM modulation, but also the quality of the sound reproduced by DAB will be greatly enhanced, making DAB's acceptance welcomed worldwide.

In order for the digital audio broadcasting (DAB) technology to be accepted by the broadcasting industry, as well as the industry that produces the associated electronic equipment, one system that acts as a standard must be chosen so that all participants will know the characteristics of the transmitted and received signals thereof. Some prominent foreign countries, including Western Europe and Canada, have already accepted a system known as the Eureka-147, proposed by a European consortium. The Eureka-147 system is thus becoming an the international standard for DAB.

In order for any system, such as the Eureka-147 system, to serve as a standard, it must specify all of the requirements for its data handling, such as the manner in which digital information in the form of digital pulses representative of sound is compressed and how its data contents are coded, as well as the manner in which the data is transmitted and received. The Eureka-147 system employs multiple carriers transmitted at the same time in the form of a data frame, and formatted in a coded orthogonal frequency division multiplexing (COFDM) modulation scheme.

For any system, including the Eureka-147 system, it is desired that the sample rate timing of the receiver be locked to the sample rate of the transmitted information. In FM communication systems, this is accomplished by locking the frequency of the signal receiver to the tuned station's frequency, typically by means of a phase-lock loop (PLL). In DAB systems, this is equivalent to acquiring time and frequency synchronization.

One technique for providing time synchronization of transmitted and received information employs a sine-sweep timing technique and is described in U.S. patent application Ser. No. 08/570,456, having Attorney Docket No. H-169,950, and entitled NETWORK FOR TIME SYNCHRONIZING A DIGITAL INFORMATION PROCESSING SYSTEM WITH RECEIVED DIGITAL INFORMATION, which is assigned to the assignee of the present invention, and which patent application is herein incorporated by reference.

A related technique for providing frequency synchronization of the transmitted and received information employs an AFC frequency synchronizing technique and is described in U.S. patent application Ser. No. 08/570,213, having Attorney Docket No. H-169,949, and entitled AFC FREQUENCY SYNCHRONIZATION NETWORK, which is assigned to the assignee of the present invention, and which patent application is herein incorporated by reference.

A further technique that allows for relation of the timing requirements between the transmitting and receiving elements of the Eureka-147 system employs a differential demodulator that differentially decodes, on a carrier-by-carrier basis, data contained between adjacent carriers in the Eureka-147 system. Such a technique employing a differential demodulator is described in U.S. patent application Ser. No. 08/574,095, having Attorney Docket No. H-169,951, and entitled DIFFERENTIAL DEMODULATOR, which is assigned to the assignee of the present invention, and which patent application is herein incorporated by reference.

The Eureka-147 system accommodates the foregoing techniques for providing time synchronization of transmitted and received information by having time synchronization symbols placed at the beginning of each data frame transmitted by its transmitter. As described in U.S. patent application Ser. No. 08/570,213, having Attorney Docket No. H-169,949, a frequency synchronization symbol, namely an AFC frequency synchronization symbol, may further be included adjacent the time synchronization symbols to thereby provide frequency synchronization between the transmitted and received information.

The foregoing time synchronization techniques detect the time synchronization symbols and determine therefrom the time location of the digital samples within each data frame. A timing synchronization network then produces a timing synchronization pulse which provides a time reference for the location of the data samples within the data frame. Sequential data frames are spaced apart in time such that the timing synchronization pulse occurs periodically, which may typically be every 24 milliseconds. Such a periodic timing synchronization pulse represents a relatively slow time base, producing a low-frequency signal that requires integration due, in part, to multipath interference effects involved in the reception of broadcast information in automotive applications. What is therefore needed is a sample-clock timing arrangement operable to acquire and maintain sample-clock timing synchronization to thereby correct the integration effects on the timing synchronization pulse, and thereby correctly lock the data sample rate of the receiving system to the transmitted information. Such sample-clock timing may then be used to properly drive a source decoding arrangement such as, for example, a Musicam. Preferably, such a sample-clock timing arrangement may easily be integrated into a DAB system such as the Eureka-147.

SUMMARY OF THE INVENTION

The forgoing needs and requirements are addressed by the present invention. In accordance with one aspect of the present invention, a phase-lock loop network for providing data sample-clock timing in a digital signal processing system receiving digital information defined by frames of multiple adjacent carriers transmitted simultaneously, wherein the digital processing system includes a data buffer receiving a number of data samples at predefined intervals and means for providing a synchronization signal corresponding to commencement of the predefined intervals, comprises means for providing a fixed frequency signal, means for providing a variable frequency signal, means for maintaining a count of the data samples within the data buffer, and means responsive to the synchronization signal and to the fixed frequency signal to provide a data input clock signal to the data buffer to thereby clock the number of data samples herein. The means responsive to the synchronization signal is further responsive to the count of data samples within the data buffer to control the frequency of the variable frequency signal and provide a data output clock signal to the data buffer in accordance therewith to thereby clock the number of data samples from the data buffer while maintaining a nominal number of data samples therein.

In accordance with another aspect of the present invention, a combination includes a digital signal processing system including a data buffer having a first input receiving a data input clock signal, a second input receiving a number of data samples in accordance with clock pulses of the data input clock signal, a third input receiving a data output clock signal, and an output providing the number of data samples in accordance with pulses of the data output clock signal, and a phase-lock loop network for providing the data input and output clock signals. The phase-lock loop network comprises a clock generator having a first input receiving a frequency control signal, a first output providing a first clock signal, and a second output providing a second clock signal, wherein the second clock signal has a frequency defined by the frequency control signal. A clock controller is also included and has a first input receiving the first clock signal and a first output providing the data input clock signal corresponding thereto, a second input receiving the second clock signal and a second output providing the data output clock signal corresponding thereto, a third input receiving a count signal corresponding to a count of the data samples within the data buffer, and a third output providing the frequency control signal in accordance with the count signal to thereby cause the frequency of the second clock signal to vary in accordance with the number of data samples within the data buffer. The varying frequency of the second clock signal maintains a nominal number of data samples within the data buffer. A clock counter is further included and has a first input receiving the data input clock signal and an output providing the count signal, wherein the clock counter increments the count of data samples with each clock pulse of the data input clock signal, compares the count of data samples with the nominal number of data samples, and provides the count signal in accordance with deviation of the count of data samples from the nominal number of data samples. One object of the present invention is to provide a technique and arrangement for locking the sample rate of the receiver of the Eureka-147 system to the transmitted information thereof, and which locking does not suffer from any multipath interference effects.

Another object of the present invention is to provide a digital phase-lock loop network cooperating with a data buffer in which the network controls the output flow rate of the data buffer to thereby maintain a nominal number of data samples therein.

These and other objects of the present invention will become more apparent from the following description of the preferred embodiment.

DESCRIPTION OF THE PREFERRED EMBODIMENT

Figure 1:
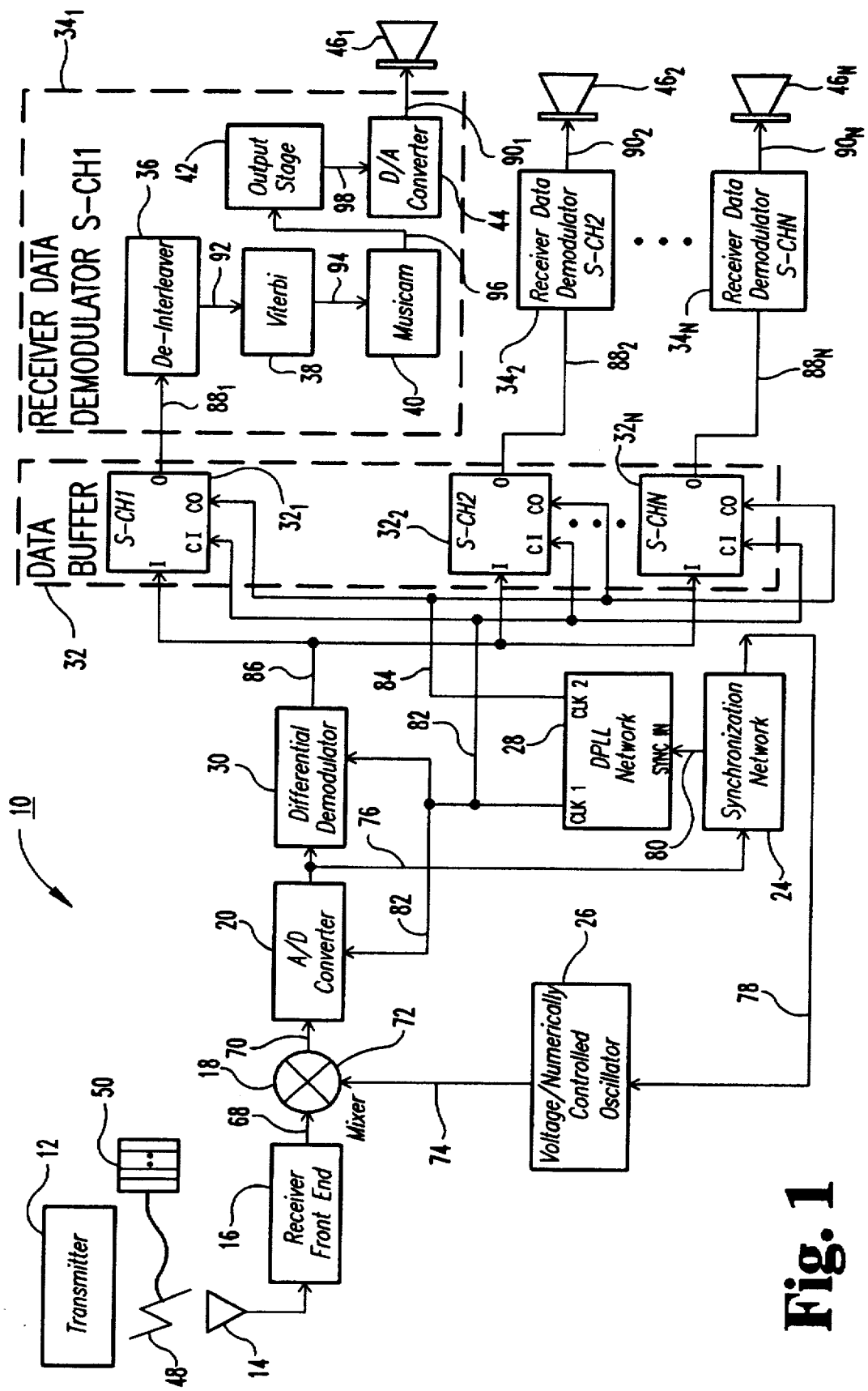
FIG. 1 is a block diagram of the present invention particularly suited for the Eureka-147 system.

For the purposes of promoting an understanding of the principles of the invention, reference will now be made to the embodiment illustrated in the drawings and specific language will be used to describe the same. It will nevertheless be understood that no limitation of the scope of the invention is thereby intended, such alterations and further modifications in the illustrated device, and such further applications of the principles of the invention as illustrated therein being contemplated as would normally occur to one skilled in the art to which the invention relates.

Referring to the drawings, wherein like numbers designate like elements, there is shown in FIG. 1 a block diagram of a digital signal processing system 10 utilizing principles that are directly applicable to the Eureka-147 system discussed in the "Background" section. The Eureka-147 serves as at least one standard for the new digital broadcast technology known as digital audio broadcasting (DAB). The DAB is anticipated as replacing the FM modulation method for the transmission and reception of the sound information contained in a bandwidth that includes a range of sound frequencies from approximately 20 to 20,000 Hz.

The Eureka-147 employs a modulation technique known as coded orthogonal frequency division multiplexing (COFDM) that is described in the technical article "Digital Sound Broadcasting to Mobile Receivers" of B. LeFloch et al., published in the *IEEE Transactions* on Consumer Electronic, Vol. 35, No. 3, August, 1989. The Eureka-147 system operates in three modes whose general definition is given in Table 1.

TABLE 1

| EUREKA-147 SYSTEM OF ABOUT 2 MHZ BANDWIDTH | | | |
|---|---|---|---|
| | MODE I | MODE II | MODE III |
| $T_F$ | 96 ms | 24 ms | 24 ms |
| $T_{NULL}$ | 1.297 ms | 324 _s | 168 _s |
| Ts | 1.246 ms | 312 _s | 156 _s |
| ts | 1 ms | 250 _s | 125 _s |
| _ | 246 _s | 62 _s | 31 _s |
| J | 76 | 76 | 153 |

TABLE 1-continued

EUREKA-147 SYSTEM OF ABOUT 2 MHZ BANDWIDTH

|  | MODE I | MODE II | MODE III |
|---|---|---|---|
| n | 2048 | 512 | 256 |
| fmax | 325 MHZ | 1.5 Ghz | 3.0 Ghz |
| Active Carriers | 1536 | 384 | 192 |
| Virtual Carriers | 512 | 128 | 64 |
| fsep | 1 kHz | 4 kHz | 8 kHz |
| $T_{BW}$ | 1.536 MHZ | 1.536 MHZ | 1.536 MHZ |
| fsample | 2.048 MHZ | 2.048 MHZ | 2.048 MHZ |

Referring to Table 1, $T_F$ is the overall data frame duration, $T_{NULL}$ is a null symbol duration, $t_s$ is the useful symbol duration, $\Delta$ is a guard interval duration $T_s$ is the overall symbol duration; $T_s=t_s+\Delta$, J is the number of symbols per frame (the null symbol being excluded), n is the maximum number of carriers for the considered system bandwidth, $f_{max}$=highest carrier frequency for $\beta=f_{max}*T_s<0.08$, Active Carriers=carriers of Orthogonal Frequency Division Multiplexing (OFDM) signals that contain information, Virtual Carriers=carriers with no information, $f_{sep}$=carrier separation, $T_{BW}$=total actual signal bandwidth, and $f_{sample}$=sample rate for a Fast Fourier Transform (FFT) operation.

The Eureka-147 system utilizes multiple frequency domain carriers as vehicles for digital sound information rather than a single-carrier having a high data rate. The usage of such multiple carriers increases the data symbol duration so as to avoid intersymbol interference associated with delay spread of an RF channel and provides an increased bandwidth to thereby reduce narrow-band multipath effects. The Eureka-147 system employing the principles of the present invention includes a data buffer whose output flow rate is controlled by data clock signals derived in such a manner as to avoid any overflow or underflow conditions of the data buffer and, thereby, avoid any data reception errors.

The Eureka-147 systems employment of multiple carriers is unlike conventional digital modulating systems that utilize single carriers employing quadrature phase shift keyed (QPSK) or biphase shift keyed (BPSK) modulation schemes. In such single carrier systems, data bit timing is typically achieved using well known early-late gate synchronization techniques. However, such early-late gate synchronization techniques cannot be used with a multiple carrier system, such as the Eureka-147, which transmits the multiple carriers simultaneously. Rather, the Eureka-147 system may be provided with synchronization by means of sample clock timing that utilizes the timing synchronization symbols contained within each data frame. However, as discussed in the "Background" section, such a time synchronization technique requires integration of the timing synchronization pulses to avoid multipath interference effects. The present invention utilizes the integrated timing synchronization pulses to derive a data buffer clocking scheme that provides appropriate data sample-clock timing to thereby lock the data sample rate of the receiver to that of the transmitted information. The system 10 of the present invention that transmits and receives digital information defined by the Eureka-147 system comprises the plurality of elements given in Table 2.

TABLE 2

| REFERENCE NO. | ELEMENT |
|---|---|
| 12 | TRANSMITTER |
| 14 | RECEIVING ANTENNA |
| 16 | RECEIVER FRONT END |
| 18 | MIXER |
| 20 | A/D CONVERTER |
| 24 | SYNCHRONIZATION NETWORK |
| 26 | VOLTAGE/NUMERICALLY CONTROLLED OSCILLATOR |
| 28 | DIGITAL PHASE-LOCK LOOP NETWORK |
| 30 | DIFFERENTIAL DEMODULATOR |
| 32 ($32_1$–$32_N$) | DATA BUFFER(S) |
| 34 ($34_1$–$34_N$) | RECEIVER DATA DEMODULATOR(S) |
| 36 | DE-INTERLEAVER |
| 38 | VITERBI |
| 40 | MUSICAM |
| 42 | OUTPUT STAGE |
| 44 | A/D CONVERTER |
| 46 ($46_1$–$46_N$) | SPEAKER(S) |

The transmitter 12 and the receiver front end 16, both of FIG. 1, are interconnected by a communication link 48 that comprises coded digital information 50 in the form of a stream of digital data, which stream of data may be further described with reference to FIG. 2, composed of FIGS. 2A, 2B, 2C, and 2D.

Figure 2A:
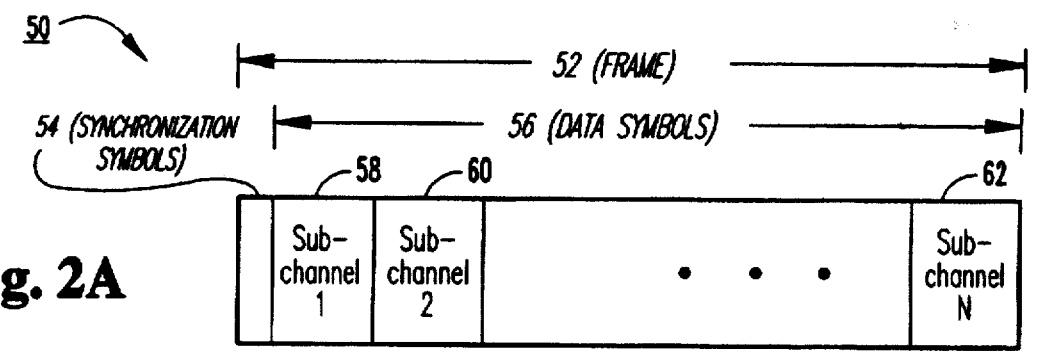
FIG. 2 is composed of FIGS. 2A, 2B, 2C and 2D that illustrates the frame structure of the stream of digital information transmitted by the transmitter of FIG. 1 and received by the receiver front end also illustrated in FIG. 1.

The digital information 50 depicted in FIG. 2A is defined by frames, such as frame 52, having a predetermined duration with a typical duration value of 0.024 seconds (see Table 1). Frame 52 defines a structure having a juxtaposition arrangement that includes synchronization symbols 54 which occur first in time in frame 52, followed by data symbols 56 which are defined by time multiplexed digital sound information for sub-channel 1, sub-channel 2, . . . sub-channel N, shown respectively by blocks 58, 60 . . . 62. It is to be understood that the information of sub-channel 1, sub-channel 2, . . . sub-channel N can represent stereo/mono audio or data information.

Figure 2B:
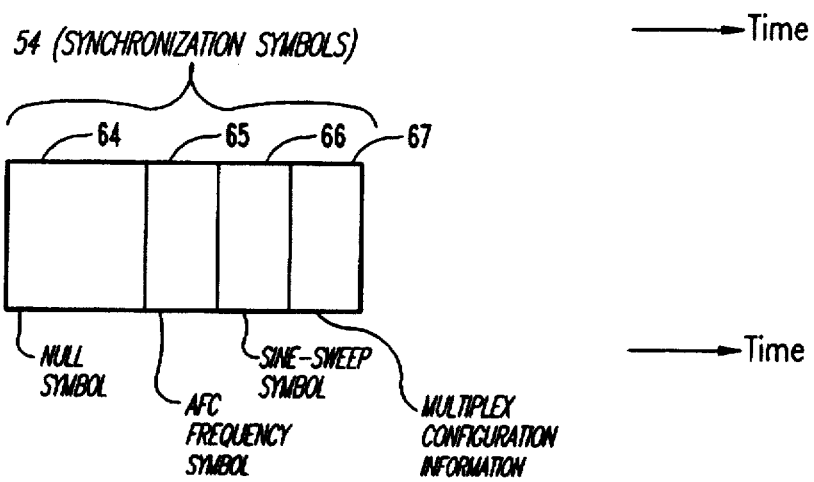

The synchronization symbols 54, shown in FIG. 2B, comprise symbols designated null symbol, AFC frequency symbol, sine-sweep symbol, and multiplex configuration information, and are respectively indicated as 64, 65, 66, and 67. Some of these synchronization symbols 54 serve as timing information which are added at the beginning of each frame 52 to permit the receiver to time synchronize with the data stream 50. The null 64 and sine-sweep 65 symbols are of particular importance to the present invention, and are more fully described hereinafter.

Figure 2C:
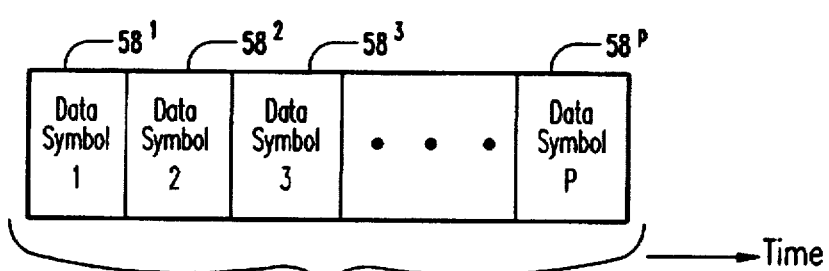
Figure 2D:
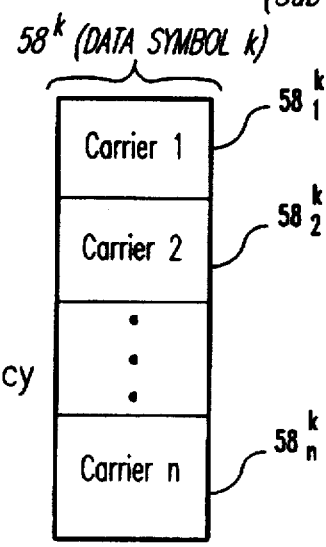

As seen in FIG. 2C, each of the sub-channels, such as sub-channel 1 (58), is further defined as containing multiple adjacent data symbols, data symbol 1, data symbol 2, data symbol 3, . . . data symbol p, respectively shown in blocks $58^1$, $58^2$, $58^3$, and $58^p$. With reference to FIG. 2D, each data symbol, such as the kth data symbol ($58^k$), is further defined as containing multiple carriers, carrier (1), carrier (2), carrier (3), . . . carrier (n), respectively shown in blocks $58^k{}_1$, $58^k{}_2$, $58^k{}_3$, and $58^k{}_n$, wherein the n carriers are spread over a frequency bandwidth of interest (see Table 1). Each of the carriers are phase modulated between adjacent data symbols so that each carrier is phase modulated over time. Thus, each of the n carriers are transmitted simultaneously as a data symbol, and each of the p data symbols are transmitted at discrete time intervals. Frames 52 of data are typically transmitted very 24–96 milliseconds (see Table 1). In accordance with the Eureka-147 format, the synchronization of data sampling by system 10 with the transmitted data may be determined by the repetitive occurrence of the null and sine-sweep symbols, and may be further described with reference back to FIG. 1.

The transmitter 12 transmits the digital data stream 50 comprising digital information frame 52 which is received by antenna 14 which, in turn, routes the received information to the receiver front end 16. The receiver front end 16 may have amplifying means to amplify the received signals and routes such received/amplified signals to a mixer 18 by way of signal path 68. The mixer 18, in response to the signal on its first input 68 and that applied to its second input by way of signal path 74 generated by voltage/numerically controlled oscillator 26, combines its input signals and develops an output signal whose frequency is equal to the difference between the frequencies of its input signals, and routes such an output signal to the A/D converter 20 by way of signal path 70. Mixer 18 thus provides a frequency-adjusted analog signal that is routed to the A/D converter 20. The digital quantities generated by the A/D converter 20 are routed, by way of signal path 76, to the differential demodulator 30 which, in turn, provides demodulated data samples to the data buffer 32 by way of signal path 86. One such differential demodulator 30 for use with system 10 is described in previously mentioned U.S. patent application Ser. No. 08/574,095, having Attorney Docket No. H-169, 951.

The data buffer 32, which may comprise N such data buffers $32_1$–$32_N$ corresponding to an N-channel system, provides the digital data samples, at the proper sample rate, to a source decoder, which may comprise N receiver data demodulators $34_1$–$34_N$ for an N-channel system. In such an N-channel system, each data buffer $32_1$–$32_N$ receives data samples at a data input I and provides, at a data output O, data samples corresponding to the appropriate sub-channel to a corresponding receiver data demodulator $34_1$–$34_N$ via a corresponding signal path $88_1$–$88_N$.

Each receiver data demodulator $34_1$–$34_N$ may comprise a number of source decoders for decoding the data samples, which decoded information is thereafter routed to a corresponding speaker $46_1$–$46_N$ via a corresponding signal path $90_1$–$90_N$. For example, receiver data demodulator $34_1$ is shown in FIG. 1 as comprising a De-Interleaver 36 connected to data buffer $32_1$ via signal path $88_1$, a Viterbi 38 connected to De-Interleaver 36 via signal path 92 and a Musicam 40 connected to Viterbi 38 via signal path 94. In any case, decoded data is provided from the number of source decoders to an output stage 42 via signal path 96, the output of which is provided to D/A converter 44 via signal path 98. The D/A converter 44 provides output analog quantities that are routed to the speaker $46_1$ by way of signal path $90_1$. The speaker $46_1$ reproduces the correct information that was accepted by the A/D converter 20 from mixer 18.

Data sample timing within system 10 is provided by synchronization network 24 in cooperation with digital phase-lock loop network 28. Synchronization network 24 receives the digital information provided by A/D converter 20 via signal path 76 and processes the synchronization symbols 54 (FIG. 2A) contained therein to provide the previously mentioned timing synchronization pulses to digital phase-lock loop network 28 by way of signal path 80, and further provides a frequency-correcting signal to voltage/ numerically controlled oscillator 26 via signal path 78. As described in previously mentioned U.S. patent application Ser. No. 08/570,456, having Attorney Docket No. H-169, 950, synchronization network 24 processes the null symbol 64 and sine-sweep symbol 66 (FIG. 2B) to provide the timing synchronization pulses which permits system 10 to determine the time location at which the data symbols 56 are located within any given data frame 52. Similarly, as described in previously mentioned U.S. patent application Ser. No. 08/570,213, having Attorney Docket No. H-169, 949, synchronization network further processes the AFC frequency symbol 65 (FIG. 2B) to provide the frequency-correcting signal to voltage/numerically controlled oscillator 26 to thereby lock the operating frequency of system 10 to the frequency of the received digital information 50.

Digital phase-lock loop network 28, in a manner as to be more fully described hereinafter, receives the timing synchronization pulses at a SYNC IN input by way of signal path 80 and provides two separate clock signals CLK1 and CLK2. Clock signal CLK1 is provided to A/D converter 20, differential demodulator 30, and to a clock input CI of each data buffer $32_1$–$32_N$ of the N-channel system 10 by way of signal path 82. Clock signal CLK2 is provided to a clock output CO of each data buffer $32_1$–$32_N$ by way of signal path 84. Generally, clock signal CLK1 permits A/D converter 20, differential demodulator 30 and each of the N data buffers $32_1$–$32_N$ lock to the sample rate of the transmitted digital information 50. Each of the timing synchronization pulses received from synchronization network 24 via signal path 80 synchronizes clock signal CLK1 with the proper time location of the data symbols 56 (FIG. 2A) within a data frame 52. Clock signal CLK2, on the other hand is a variable clock which is adjustable by digital phase-lock loop network 28 to match the average rate of CLK1 in order to avoid data overflow or data underflow of the data buffers $32_1$–$32_N$. One embodiment of a digital phase-lock loop network 28 for use by system 10 of FIG. 1 is shown in FIG. 3, and which network comprises the plurality of elements given in Table 3.

TABLE 3

| REFERENCE NO. | ELEMENT |
| --- | --- |
| 100 | CLOCK CONTROLLER |
| 102 | INPUT CLOCK DRIVER |
| 104 | OUTPUT CLOCK DRIVER |
| 106 | FREE RUNNING REFERENCE CLOCK |
| 108 | FIXED/VARIABLE FREQUENCY DIVIDER |
| 120 | DATA BUFFER COUNTER |
| 124 | BUFFER COUNTER INITIALIZER |

Figure 3:
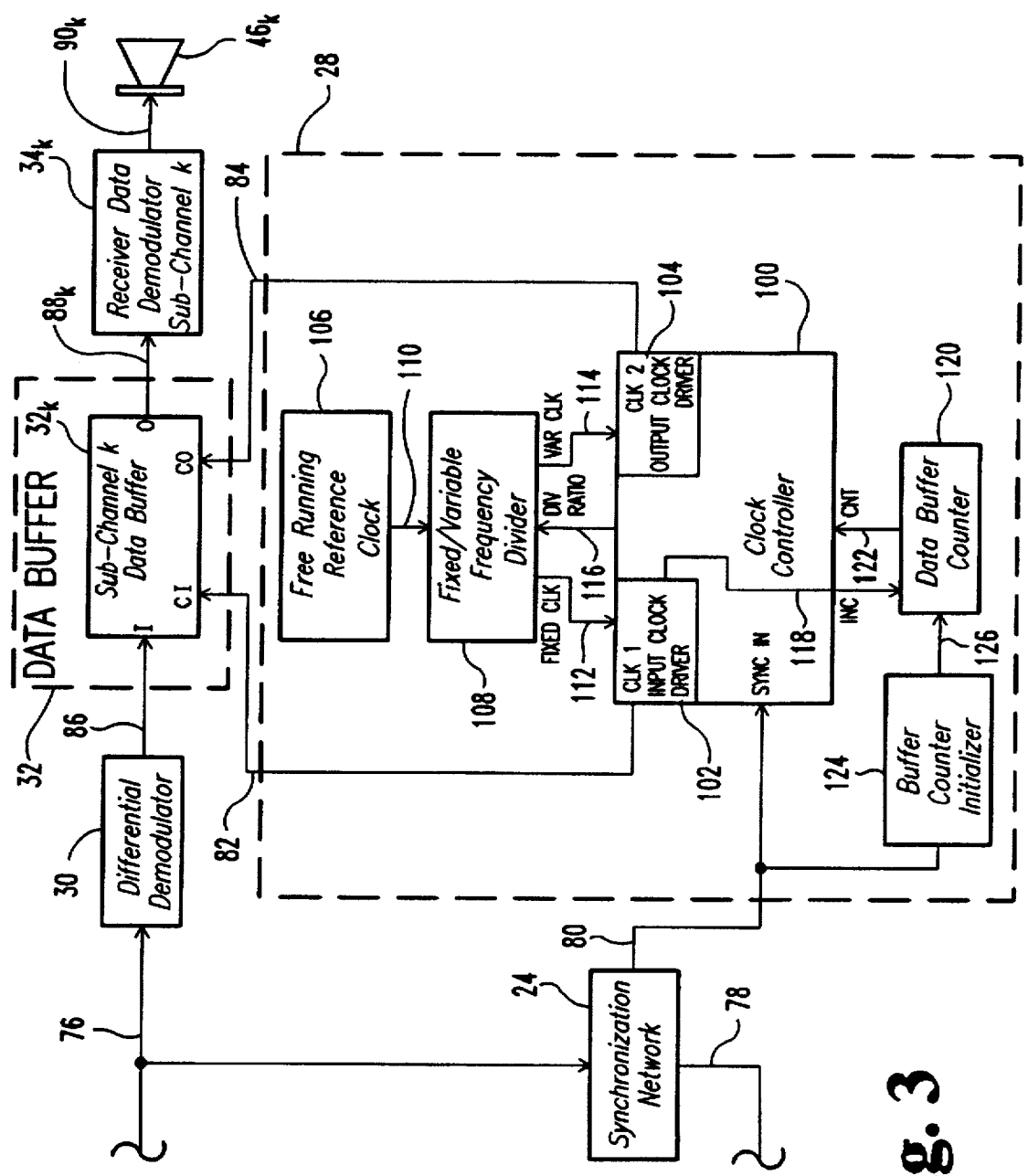
FIG. 3 is a block diagram of one embodiment of a digital phase-lock loop network, in accordance with one aspect of the present invention, for use with the system of FIG. 1.

Referring now to FIG. 3, the operation of the digital phase-lock loop network 28 will be described with respect to a single data buffer, namely data buffer $32_k$ which corresponds to the data buffer for sub-channel k of an N-channel system 10 such as that shown in FIG. 1. Those skilled in the art will recognize that the concepts to be described hereinafter may easily be extended to an N-channel data buffer 32 as shown in FIG. 1.

The data buffer $32_k$ has separate clock inputs, namely input clock CI, corresponding to CLK1 of clock controller 100 which is provided thereto by input clock driver 102 via signal path 82, and output clock CO, corresponding to CLK2 of clock controller 100 which is provided thereto by output clock driver 104 via signal path 84. CLK1 occurs as a burst of a fixed frequency clock in accordance with the previously described timing synchronization pulse, corresponding to a frame of digital information 50 (FIG. 2), which is provided to input SYNC IN of clock controller 100 by synchronization network 24 via signal path 80. CLK1 is thus gated to data buffer $32_k$ via the periodic timing synchronization pulses. CLK1 and CLK2 are derived from the same fixed frequency reference clock provided to fixed/variable frequency divider 108 by free running reference clock 106 via signal path 110.

Fixed/variable frequency divider 108 preferably includes a number of frequency divider portions for providing reduced frequency signals each corresponding to a predetermined frequency division of the reference clock. One such frequency signal, namely a FIXED CLK signal, is a fixed rate clock signal corresponding to a predetermined frequency division of the reference clock, and is provided at an output of the fixed/variable frequency divider to an input of clock controller 100 via signal path 112. The FIXED CLK signal is received by input clock driver 102 which, in turn, provides the CLK1 signal therefrom. Another such frequency signal, namely a VAR CLK signal, is a variable rate clock signal corresponding to one of a number of predefined frequency divisions of the reference clock, and is provided at an output of the fixed/variable frequency divider to an input of clock controller 100 via signal path 114. The VAR CLK signal is received by output clock driver 104 which, in turn, provides the variable frequency CLK2 signal therefrom.

In one embodiment of digital phase-lock loop 28, the reference clock provided by free running reference clock 106 is 16.384 MHZ. The FIXED CLK signal is provided by a divide-by-eight frequency divider and is therefore provided to input clock driver 102 as 2.048 MHZ. The VAR CLK signal is preferably realized using three divide-by portions, namely a divide-by-three, divide-by-four and a divide-by-five frequency divider. The three divide-by portions therefore provide three separate fixed frequency signals as 5.461 MHZ, 4.096 MHZ, and 3.277 MHZ respectively. Any one of the three fixed frequency signals may further reduced by a divide-by-sixteen frequency divider in accordance with a DIV RATIO signal provided by clock controller 100 at an output thereof to an input of the fixed/variable frequency divider 108 via signal path 116, to thereby provide VAR CLK. Thus, VAR CLK may, in a preferred embodiment, be 341 kHz, 256 kHz, or 205 kHz, depending upon the status of the DIV RATIO signal provided by clock controller 100. It is to be understood, however, that any number of such divide-by portions having any desired divide ratio may be used to practice the present invention.

The input clock driver 102 of clock controller 100 further provides CLK1 to an increment (INC) input of a data buffer counter 120 via signal path 118. In turn, data buffer counter 120 provides a count (CNT) signal corresponding to any deviation between the number of data samples within the data buffer $32_k$ and a nominal number of data samples. The CNT signal is provided at an output of data buffer counter 120 to an input of clock controller 100 via signal path 122.

A buffer counter initializer 124 is further provided and includes an input for receiving the timing synchronization pulses from synchronization network 24 via signal path 80. The output of initializer 124 is provided to an input of data buffer counter 120 via signal path 126, and initializes data buffer counter 120 to an initial number of data samples.

The operation of digital phase-lock loop network 28 will now be described in detail. Upon receipt of a timing synchronization pulse from synchronization network, corresponding to a frame 52 of digital information, buffer counter initializer 124 initializes the data buffer counter 120 to have an initial count corresponding to an initial number (INIT) of data samples within the data buffer $32_k$. Preferably, the data buffer is sized according to requirements imposed by the data frame format and should be nominally half full. However, the initial count (INIT) should be less than the nominal number to thereby provide sufficient headroom in the data buffer $32_k$ for the burst of data samples input thereto (at input I). If INIT is set too high, the data buffer may run out of storage capacity before the slower rate output data can be clocked therefrom (at output O). Similarly, the initial count (INIT) should be high enough so that sufficient data samples initially reside within data buffer $32_k$. Specifically, INIT should be high enough so that the output clock (CO) does not deplete the data samples therefrom before sufficient new data samples can be clocked therein by the input clock (CI). Buffer counter initializer 124 thus initializes the data buffer counter 120 to have an initial count, (INIT), wherein INIT is subject to the foregoing requirements.

In response to the CNT signal corresponding to the count of the data buffer counter 120, clock controller 100 directs input clock driver 102 to provide INIT CLK1 pulses to thereby initialize data buffer $32_k$ by providing INIT data samples therein. Thereafter, data samples are clocked into and out of data buffer $32_k$ in accordance with the previously explained CLK1 and CLK2 rates for each subsequent data frame 52.

A counter of the data buffer counter 120 is incremented with each CLK1 pulse, and clock controller 100 analyzes CNT once per data frame 52. The difference between the actual count of samples within data buffer $32_k$ and the nominal count of data samples therein (CNT) represents an error in the CLK2 frequency, which clock controller 100 uses to control the fixed/variable frequency divider 108. Preferably, variation thresholds are established within clock controller 100 to quantize the error into three levels so that only the three previously described CLK2 frequencies are required to correct the data output rate of the data buffer $32_k$ to maintain the nominal count of data samples therein. The minimum and maximum of these CLK2 frequencies are determined by the allowed tolerance of the clock at the transmitter and of the receiver.

Clock controller 100 monitors the data buffer count difference (CNT) and provides fixed/variable frequency divider 108 with a frequency control signal, preferably in the form of a DIV RATIO signal, corresponding thereto. If the actual number of data samples within the data buffer $32_k$ is greater than a first threshold number of data samples, clock controller 100 sets the DIV RATIO signal to choose the divide-by-three frequency division of the reference clock to thereby increase the CLK2 frequency and the corresponding data output flow rate from data buffer $32_k$. Similarly, if the actual number of data samples within the data buffer $32_k$ is less than a second threshold number of data samples, clock controller 100 sets the DIV RATIO signal to choose the divide-by-five frequency division of the reference clock to thereby decrease the CLK2 frequency and the corresponding data output flow rate from data buffer $32_k$. Under nominal conditions, corresponding to a data buffer count value of between the first and second threshold values, clock controller 100 sets the DIV RATIO signal to choose the divide-by-four frequency division of the reference clock to thereby maintain the CLK2 frequency and the corresponding data output flow rate from data buffer $32_k$ at their nominal values.

In the operation of the fixed/variable frequency divider 108 just described, it should be pointed out that the divide-by-three and divide-by-five operations are preferably not allowed to operate continuously, but are instead selected by clock controller 100 only periodically as "corrections" so as to limit the possible range of CLK2 frequency to be able to correct for the tolerances of the system 10. Since such "corrections" are applied evenly throughout the data frame 52, the frequency of CLK2 appears as nearly constant.

Figure 4:
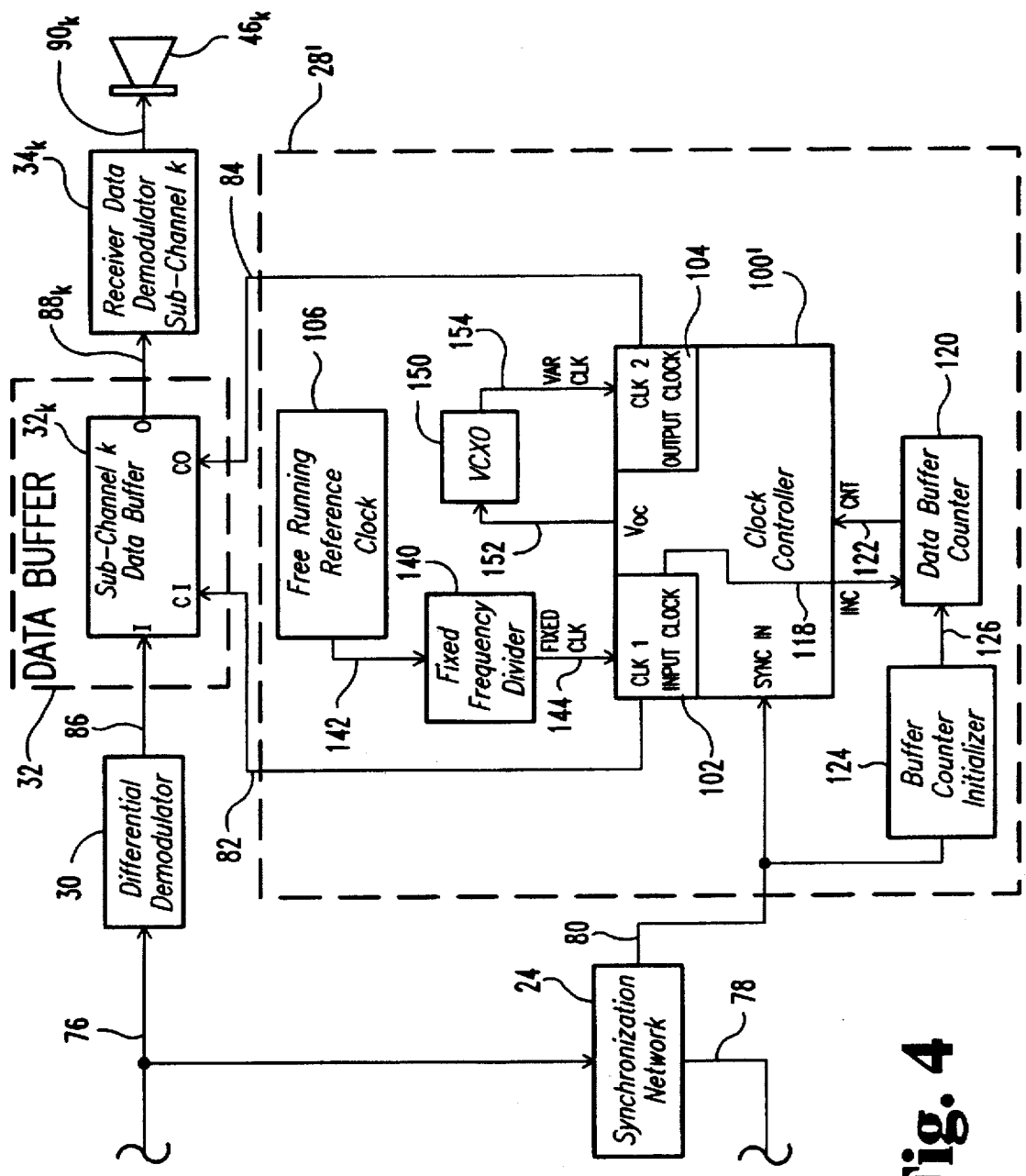
FIG. 4 is a block diagram of an alternative embodiment of a digital phase-lock loop network, in accordance with another aspect of the present invention, for use with the system of FIG. 1.

Referring now to FIG. 4, an alternative digital phase-lock loop network 28' is shown which, in most respects, is identical to network 28 of FIG. 3. A first exception is that the reference clock signal of free running reference clock 106 is provided to an input of a fixed frequency divider 140 via signal path 142, and the FIXED CLK signal is provided at an output thereof to input clock driver 102 of clock controller 100' via signal path 144. Fixed frequency divider 140 is operable to provide input clock driver 102 with a fixed frequency division of the reference clock as described with respect to FIG. 3. A second exception is that the frequency control signal, provided as a DIV RATIO signal from clock controller 100 in the digital phase-lock loop network 28 of FIG. 3, is provided from clock controller 100' as an input $V_{OC}$ signal to a voltage-controlled crystal oscillator (VCXO) 150 via signal path 152. The output of the VCXO 152 is provided as the VAR CLK signal to output clock driver 104 of clock controller 100' via signal path 154. In operation, clock controller 100' provides an oscillator control voltage $V_{OC}$ to VCXO in response to the data buffer count (CNT) to thereby provide output clock controller 104 with a variable frequency signal, which is used by clock controller 100' to provide a variable CLK2 signal to data buffer $32_k$. In a similar manner as the network 28 of FIG. 3, controller 100' controls the voltage $V_{OC}$ to increase the frequency of CLK2 as the number of data samples within the data buffer $32_k$ increases above a first data sample number threshold, and to decrease the frequency of CLK2 as the number of data samples within the data buffer $32_k$ decreases below a second data sample number threshold.

From FIGS. 1, 3 and 4, it should now be apparent that the synchronization networks, namely synchronization network 24 and digital phase-lock loop network 28, operates in parallel to the data demodulation path. Timing synchronization updates of the sine-sweep symbol 66 yield frame pulses which are passed to the digital phase-lock loop network 28 by the synchronization network 24. The digital phase-lock loop of the present invention controls the output sample clock which is used by all elements of the receiving system 10 after the data buffer 32. It should be noted that if the system 10 decodes several channels of information simultaneously, the same output sample clock CLK2 may be used for all channels. However, independent data buffer initializers 126 and input sample clock outputs CLK1 will be required for each channel. While the invention has been illustrated and described in detail in the foregoing drawings and description, the same is to be considered as illustrative and not restrictive in character, it being understood that only the preferred embodiment has been shown and described and that all changes and modifications that come within the spirit of the invention are desired to be protected.

The embodiments of the invention in which an exclusive property or privilege is claimed are defined as follows:

1. A phase-lock loop network for providing data sample-clock timing in a digital signal processing system receiving digital information defined by frames of multiple adjacent carriers transmitted simultaneously, wherein the digital processing system includes a data buffer receiving a number of data samples at predefined intervals and means for providing a synchronization signal corresponding to commencement of the predefined intervals, the network comprising:

means for providing a fixed frequency signal;

means for providing a variable frequency signal;

means for maintaining a count of the data samples within the data buffer; and means responsive to the synchronization signal for providing a data input clock according to said fixed frequency signal to the data buffer to thereby clock the number of data samples therein, and further responsive to the count of data samples within the data buffer for controlling the frequency of said variable frequency signal and providing a data output clock according to said variable frequency signal to the data buffer to thereby clock the number of data samples from the data buffer while maintaining a nominal number of data samples therein.

2. The phase-lock loop network of claim 1 wherein said means for providing a fixed frequency signal includes:

a free running reference clock providing a reference clock signal having a first frequency; and a first frequency divider responsive to said reference clock signal to provide said fixed frequency signal having a second frequency;

wherein said second frequency is a fraction of said first frequency.

3. The phase-lock loop network of claim 2 wherein said means responsive to a synchronization signal is further responsive to said fixed frequency signal to provide said data input clock as a predefined fraction thereof.

4. The phase-lock loop network of claim 2 wherein said means for providing a variable frequency signal is responsive to a frequency control signal provided by said means responsive to the synchronization signal to thereby vary the frequency of the variable frequency signal.

5. The phase-lock loop network of claim 4 wherein said means for providing a variable frequency signal includes a second frequency divider responsive to said reference clock signal and to said frequency control signal to provide said variable frequency signal as one of a third, fourth and fifth frequency signal;

wherein said third, fourth and fifth frequency signals are each predefined fractions of said first frequency.

6. The phase-lock loop network of claim 5 wherein said third frequency signal has a frequency of approximately ⅓ of said first frequency, said fourth frequency signal has a frequency of approximately ¼ of said first frequency, and said fifth frequency signal has a frequency of approximately ⅕ of said first frequency.

7. The phase-lock loop network of claim 5 wherein said means responsive to the synchronization signal is further responsive to said variable frequency signal to provide said data output clock as a predefined fraction thereof.

8. The phase-lock loop network of claim 4 wherein said means for providing a variable frequency signal includes a voltage controlled oscillator responsive to said frequency control signal to provide said variable frequency signal as a varying fraction of said first frequency.

9. The phase-lock loop network of claim 1 wherein said means for maintaining a count of the data samples within the data buffer is a data buffer counter, said data buffer counter responsive to said data input clock signal to increment a count value of the data buffer counter with every clock pulse thereof, said data buffer counter comparing said count value to said nominal number of data samples and providing a count signal corresponding thereto.

10. The phase-lock loop network of claim 1 wherein said means responsive to the synchronization signal is a clock controller, said clock controller increasing the frequency of the variable frequency signal when the count of data samples within the data buffer is a predefined number above said nominal number of data samples, and decreasing the frequency of the variable frequency signal when the count of data samples within the data buffer is a predefined number below said nominal number of data samples.

11. The phase-lock loop network of claim 1 further including means responsive to the synchronization signal to initialize said means for maintaining a count of the data samples within the data buffer to an initial count.

12. In combination:

a digital signal processing system including a data buffer having a first input receiving a data input clock signal, a second input receiving a number of data samples in accordance with clock pulses of the data input clock signal, a third input receiving a data output clock signal, and an output providing the number of data samples in accordance with pulses of the data output clock signal; and a phase-lock loop network for providing the data input and output clock signals, the network comprising:

a clock generator having a first input receiving a frequency control signal, a first output providing a first clock signal, and a second output providing a second clock signal, said second clock signal having a frequency defined by said frequency control signal;

a clock controller having a first input receiving said first clock signal and a first output providing the data input clock signal according thereto, a second input receiving said second clock signal and a second output providing the data output clock signal according thereto, a third input receiving a count signal corresponding to a count of the number of data samples within the data buffer, and a third output providing said frequency control signal in accordance with said count signal to thereby cause the frequency of said second clock signal to vary in accordance with the number of data samples within the data buffer, said second clock signal thereby maintaining a nominal number of data samples within the data buffer; and a data buffer counter having a first input receiving the data input clock signal and an output providing said count signal, said data buffer counter incrementing the count of data samples with each clock pulse of the data input clock signal, comparing the count of data samples with said nominal number of data samples, and providing said count signal in accordance with deviation of the count of data samples from said nominal number of data samples.

13. The combination of claim 12 wherein the number of data samples corresponds to a frame of digital data defined by multiple adjacent carriers, wherein sequential frames of digital data are received at predefined intervals;

and wherein the digital signal processing system further includes means for providing a synchronization signal corresponding to commencement of the predefined intervals;

and wherein said clock controller includes a fourth input for receiving said synchronization signal, said clock controller providing said data input clock signal in response to said synchronization signal.

14. The combination of claim 13 wherein the phase-lock loop network further includes a data buffer counter initializer having an input receiving the synchronization signal and an output connected to a second input of said data buffer counter, said data buffer counter initializer operable to receive the synchronization signal and initialize the count of the data buffer counter to an initial count.

15. The combination of claim 12 wherein said clock generator includes:

a free running reference clock having an output providing a reference clock signal; and a frequency divider having an input receiving said reference clock signal, providing said first clock signal as a fixed frequency division thereof at said first clock generator output, and providing said second clock signal as a variable frequency division thereof at said second clock generator output.

16. The combination of claim 15 wherein said frequency divider includes a plurality of frequency division portions receiving said reference clock signal and coupled to said second clock generator output, each of said frequency division portions defining a separate frequency division ratio, said frequency divider responsive to said frequency control signal to provide said second clock signal as a predetermined frequency division ratio of said reference clock signal.

17. The combination of claim 16 wherein said plurality of frequency division portions includes a first frequency division portion having a frequency division ratio of approximately 1/3, a second frequency division portion having a frequency division ratio of approximately 1/4, and a third frequency division portion having a frequency division ratio of approximately 1/5.

18. The combination of claim 12 wherein said clock generator includes:

a free running reference clock having an output providing a reference clock signal;

a frequency divider having an input receiving said reference clock signal and providing said first clock signal as a fixed frequency division thereof; and a voltage-controlled oscillator having an input receiving said frequency control signal and an output providing said second clock signal in accordance therewith.

* * * * *